United States Patent
Kennedy et al.

(10) Patent No.: US 10,804,692 B2
(45) Date of Patent: Oct. 13, 2020

(54) HYBRID DIAMOND SOLID-STATE CIRCUIT PROTECTOR

(71) Applicant: Atom Power, Inc., Charlotte, NC (US)

(72) Inventors: Ryan Kennedy, Cornelius, NC (US); Denis Kouroussis, Markham (CA)

(73) Assignee: Atom Powers, Inc., Charlotte, NC (US)

( * ) Notice: Subject to any disclaimer, the term of this patent is extended or adjusted under 35 U.S.C. 154(b) by 260 days.

(21) Appl. No.: 15/995,851

(22) Filed: Jun. 1, 2018

(65) Prior Publication Data

US 2018/0366936 A1 Dec. 20, 2018

Related U.S. Application Data

(60) Provisional application No. 62/520,761, filed on Jun. 16, 2017.

(51) Int. Cl.
*H02H 5/04* (2006.01)
*H02H 3/087* (2006.01)
*H02H 3/06* (2006.01)
*H02H 3/08* (2006.01)
*H01L 29/16* (2006.01)
*H02H 7/00* (2006.01)
*H02H 3/093* (2006.01)
*H02H 3/05* (2006.01)
(Continued)

(52) U.S. Cl.
CPC ........... *H02H 3/06* (2013.01); *H01L 29/1602* (2013.01); *H02H 3/05* (2013.01); *H02H 3/08* (2013.01); *H02H 3/0935* (2013.01); *H02H 7/005* (2013.01); *H01L 29/1608* (2013.01); *H01L 29/2003* (2013.01); *H01L 29/7802* (2013.01); *H02H 3/087* (2013.01); *H02H 5/044* (2013.01); *H02H 5/048* (2013.01)

(58) Field of Classification Search
CPC ......... H02H 3/087; H02H 5/048; H02H 5/044
USPC .............................. 361/93.8, 93.9, 100, 101
See application file for complete search history.

(56) References Cited

U.S. PATENT DOCUMENTS

| | | | |
|---|---|---|---|
| 6,356,423 B1 * | 3/2002 | Hastings | H02H 3/087 361/93.2 |
| 8,193,848 B2 * | 6/2012 | Zhang | H01L 21/8213 327/318 |
| 8,861,162 B2 | 10/2014 | Fuller et al. | |

(Continued)

*Primary Examiner* — Gary A Nash
(74) *Attorney, Agent, or Firm* — Patent Law Professionals, P.C.; William R. Winters

(57) ABSTRACT

A solid-state circuit protector includes a first power semiconductor device having an ON resistance that increases with increasing temperature and a second power semiconductor device connected in parallel with the first power semiconductor device having an ON resistance that decreases with increasing temperature. During times when abnormally high currents are flowing through the solid-state circuit protector, the second power semiconductor is switched ON so that some or all of the current is diverted through it, thus protecting the first power semiconductor device from being damaged due to overheating. The first power semiconductor device is either switched OFF, allowing it to cool in anticipation of a lighter load, or is configured to remain ON so that it shares the burden of carrying the high current with the parallel-connected second power semiconductor device yet operates cooler and at a lower ON resistance since it is not required to pass the full current.

18 Claims, 4 Drawing Sheets

(51) Int. Cl.
 *H01L 29/20* (2006.01)
 *H01L 29/78* (2006.01)

(56) References Cited

U.S. PATENT DOCUMENTS

| | | | |
|---|---|---|---|
| 2005/0201032 A1* | 9/2005 | Devine | H02H 9/001 |
| | | | 361/93.1 |
| 2010/0134931 A1* | 6/2010 | Orozco | H01H 9/542 |
| | | | 361/3 |
| 2012/0218674 A1* | 8/2012 | Schultz | H02H 3/085 |
| | | | 361/93.8 |
| 2014/0139957 A1* | 5/2014 | Stockinger | H01L 27/0629 |
| | | | 361/56 |

* cited by examiner

HYBRID DIAMOND SOLID-STATE CIRCUIT PROTECTOR

CROSS-REFERENCE TO RELATED APPLICATIONS

This application claims the benefit of U.S. Provisional Patent Application No. 62/520,761, filed on Jun. 16, 2017.

BACKGROUND OF THE INVENTION

Circuit breakers are employed in electrical distribution systems to protect electrical circuits from being damaged due to abnormally high currents and excessive heat that can be generated during short circuit events and prolonged overloads. A conventional circuit breaker is mechanical in nature; it has electrical contacts that physically separate by action of a spring, electromagnet, or compressed air when a fault or prolonged overload condition occurs.

Although conventional circuit breakers have been in widespread use for many decades, they have various drawbacks and limitations. In particular, their mechanical construction limits their precision and ability to react quickly to faults. The electrical contacts and the components that control the opening and closing of the electrical contacts also tend to degrade and deteriorate over time.

To overcome the various drawbacks and limitations of conventional circuit breakers, efforts have been made in recent years to replace the electrical contacts and the actuators that control the opening and closing of the contacts with electrically controlled power semiconductor devices. Compared to conventional circuit breakers, which typically take several milliseconds to respond to a fault, power semiconductor devices can be controlled to react in a matter of microseconds. The current threshold at which a power semiconductor device "trips" can also be controlled with much greater precision. Moreover, since power semiconductor devices do not have any moving parts, they are more durable and have potentially longer lifetimes.

Despite the various advantages power-semiconductor-based circuit breakers offer, power semiconductor devices have an ON resistance $R_{ON}$ that is usually higher than the closed contact resistance of conventional circuit breakers. Although the ON resistance $R_{ON}$ is low, typically only a few milli-ohms, it nevertheless leads to $I^2R_{ON}$ losses. These $I^2R_{ON}$ losses can be significant, especially when the current flowing through the power semiconductor device is high.

$I^2R_{ON}$ losses are compounded by the fact that the ON resistance $R_{ON}$ resistance of conventional power semiconductor devices tends to increase as temperature increases. Because $I^2R_{ON}$ losses manifest in the form of heat, excessive heat generated during times when the current flowing through the power semiconductor device is high or is increasing to high magnitudes (e.g., during a fault or overload condition) can damage or even destroy the power semiconductor device, unless it is somehow conducted away from the power semiconductor device.

To avoid any possibility that the heat does not damage or destroy the power semiconductor device, prior art approaches to designing power-semiconductor-based circuit breakers typically involve increasing the size and bulk of the power semiconductor device and employing large heat sinks to conduct heat away from the semiconductor device. For this approach to be successful, the worst-case scenario of highest possible ON resistance $R_{ON}$ resistance and highest possible current (which occurs during a short-circuit fault) must be taken into consideration. Unfortunately, this will often result in an excessively large power semiconductor device and exceedingly large and bulky heat sink.

BRIEF SUMMARY OF THE INVENTION

A solid-state circuit protector and a circuit protection method are disclosed. The solid-state circuit breaker includes a first power semiconductor device having an ON resistance that increases with increasing temperature and a second power semiconductor device connected in parallel with the first power semiconductor device having an ON resistance that decreases with increasing temperature. In one embodiment of the invention, the first power semiconductor device comprises a conventional power semiconductor device, such as a silicon (Si), silicon carbide (SiC) or gallium nitride (GaN) field-effect transistor (FET), and the second power semiconductor device comprises a power semiconductor device having a diamond semiconductor current path, e.g., a FET having a diamond semiconductor source-drain channel or a bipolar junction transistor having a diamond semiconductor base.

During times when abnormally high currents are flowing through the solid-state circuit protector, the second power semiconductor is switched ON so that some or all of the current is diverted through it, thus protecting the first power semiconductor device from being damaged due to overheating. The first power semiconductor device is either switched OFF, allowing it to cool in anticipation of a lighter load, or is configured to remain ON so that it shares the burden of carrying the high current with the parallel-connected second power semiconductor device yet operates cooler and at a lower ON resistance since it is not required to pass the full current.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
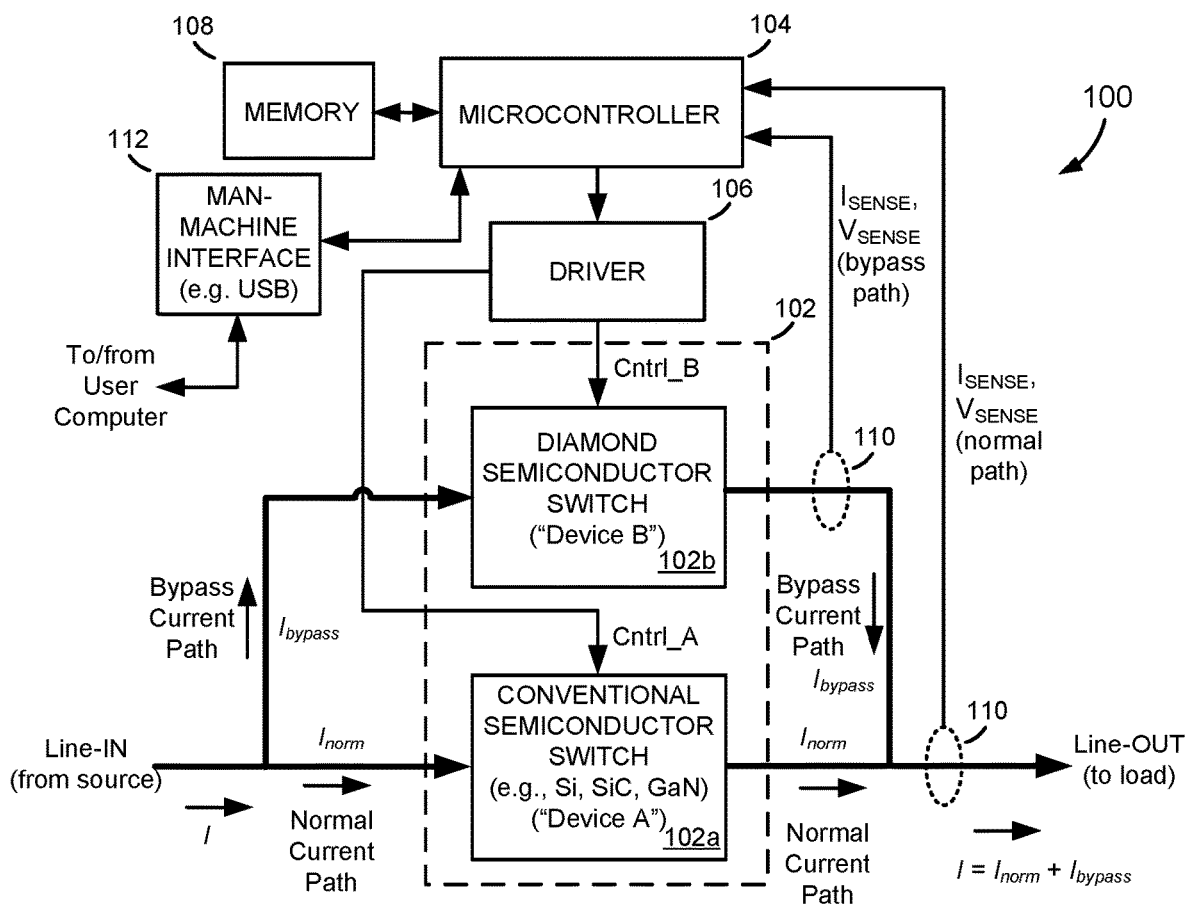
FIG. 1 is a drawing depicting a solid-state circuit protector, according to an embodiment of the present invention.

Referring to FIG. 1 there is shown a solid-state circuit protector 100, according to an embodiment of the present invention. The solid-state circuit protector 100 includes a solid-state device 102; a microcontroller 104; computer-readable memory 108; and one or more current and/or voltage sensors 110. In a preferred embodiment of the invention, the solid-state circuit protector 100 is designed to protect an electrical circuit in an electrical power distribution system, including the circuit's load and electrical wiring, from short circuit currents and other abnormally high overload and heavy load currents. However, it may be adapted to protect other electrical circuits not involving the electrical power distribution. For this reason, and to emphasize its general applicability, the term "solid-state circuit protector" is used in the description that follows, rather than the more specific term "solid-state circuit breaker."

As illustrated in FIG. 1, the solid-state device 102 comprises a conventional power semiconductor device (also referred to as "device A" below) connected in parallel with a diamond-based power semiconductor device 102b (also referred to as "device B" below). The conventional power semiconductor device 102a may comprise essentially any conventional semiconductor device but is preferably a conventional power semiconductor device having a control terminal, such as a power field-effect transistor (FET) of some kind or bipolar transistor suitable for power applications. For example, it may comprise but is not limited to, a conventional silicon (Si) power MOSFET, a silicon-carbide (SiC) power MOSFET, or a gallium-nitride based GaN-based power transistor, e.g., a GaN high-electron-mobility transistor (i.e., GaN-HEMT). The diamond-based power semiconductor device 102b comprises a power semiconductor device having a primary current path made from diamond semiconductor and is also preferably, though not necessarily, a semiconductor device having a control terminal such as, for example, a bipolar transistor having a base made from diamond semiconductor or a field-effect transistor (FET) having a diamond drain-source channel. In one particular embodiment of the invention the diamond-based power semiconductor device 102b comprises a diamond-channel junction FET (JFET). In another embodiment of the invention, it comprises a diamond-channel metal-semiconductor FET (MESFET). In yet another embodiment of the invention, it comprises a diamond-channel metal-oxide-semiconductor FET (MOSFET).

In one embodiment of the invention the solid-state circuit protector 100 further includes Line-IN and Line-OUT terminals or connectors, which allow the solid-state circuit protector 100 to be connected to corresponding Line-IN and Line-OUT receptacles, terminals, or connectors in a circuit breaker panel. Note that the exemplary solid-state circuit protector 100 invention described here and depicted in FIG. 1 is a single-phase design suitable for use in a single-phase AC distribution network or a DC power distribution network. However, the solid-state circuit protector 100 could be modified and adapted to serve as a three-phase circuit protector in a three-phase-AC distribution system, simply by duplicating the parallel-connected solid-state device 102 so that all three phases are protected, as will be appreciated by those of ordinary skill in the art.

The microcontroller 104 is responsible for controlling the ON/OFF states of the conventional and diamond-based power semiconductor devices 102a and 102b, via the driver 106, depending on load conditions sensed or measured by the current/voltage sensors 110. The memory 108 is computer-readable memory and, depending on the particular type of microcontroller being used, is either embedded in the microcontroller 104, entirely external to the microcontroller 104, or partly embedded in the microcontroller 104 and partly external to the microcontroller 104. The memory 108 also preferably comprises a combination of non-volatile memory (e.g., read-only memory (ROM) and/or programmable ROM such as electrically erasable programmable ROM (EEPROM) memory and/or Flash memory) and volatile memory (e.g., random-access memory RAM)). The volatile memory is used by the microcontroller 104 to process data and as a temporary data store, as it executes the computer program instructions and reacts to the current and/or voltage measurements measured or sensed by the current/voltage sensors 110.

Figure 2:
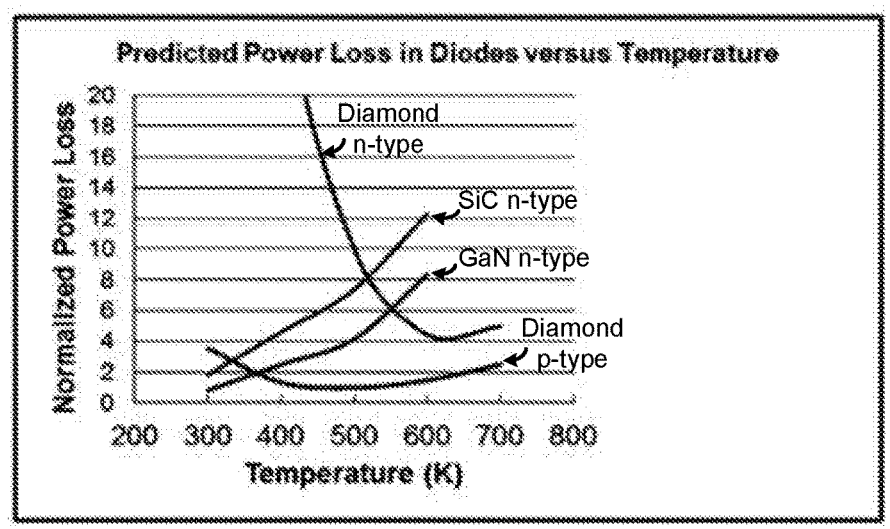
FIG. 2 is a graph comparing the power losses of n-type diamond semiconductor and p-type diamond semiconductor to the power losses of conventional n-type SiC and n-type GaN semiconductors.

FIG. 2 is a graph comparing the power losses of n-type diamond semiconductor and p-type diamond semiconductor to the power losses of conventional n-type SiC and n-type GaN semiconductors. As can be seen, the n-type diamond semiconductor has a power loss that correlates negatively with temperature, up to a temperature of about 600K, and the p-type diamond semiconductor also has a power loss that correlates negatively with temperature, up to a temperature of nearly 500K. Since power losses relate to $I^2 R_{ON}$, this negative correlation of power loss with temperature implies that the ON resistances $R_{ON}$ of n-type diamond and p-type diamond semiconductors also correlate negatively with temperature, i.e., decrease with temperature. In contrast, FIG. 2 further shows that the power loss and ON resistances $R_{ON}$ of n-type SiC and n-type GaN semiconductors correlate positively with temperature, i.e., increase with increasing temperature. As will be discussed in detail below this difference in temperature dependency of $R_{ON}$ is exploited by the solid-state circuit protector 100 and the circuit protection methods it performs.

During normal operating conditions, when the circuit current I remains significantly less than the rated current $I_{RATED}$ of the solid-state circuit protector 100, the microcontroller 104 directs the driver 106 to generate and apply a drive signal to a control input Cntrl_A of the conventional power semiconductor device 102a that causes the conventional power semiconductor device 102a to remain ON, and directs the driver 106 to also generate and apply a drive signal to a control input Cntrl_B of the diamond-based power semiconductor device 102b that causes the diamond-based power semiconductor device 102b to remain OFF. Accordingly, during normal operating conditions the circuit current I flows entirely through the conventional power semiconductor device 102, in a "Normal" current path (i.e., $I=I_{norm}$), and none of the circuit current I flows through the diamond-based power semiconductor device 102b (i.e., $I_{bypass}=0$). If, however, the microcontroller 104 determines that the circuit current I has increased to a level that might cause harm to the circuit being protected (e.g., to the circuit's load or circuit wiring), the microcontroller 104 directs the driver 106 to switch the diamond-based power semiconductor device 102b ON. By switching the diamond-based power semiconductor device 102b ON, some or all of the circuit current I is diverted into a "Bypass" current path containing the diamond-based power semiconductor device 102b. Whether all or only some of the circuit current I is diverted into the Bypass current path depends on whether the conventional power semiconductor device 102a is switched OFF or is allowed to remain ON after the diamond-based power semiconductor device 102b is switched ON. Either alternative is possible and both are contemplated in the various embodiments of the invention described herein.

Figure 3:
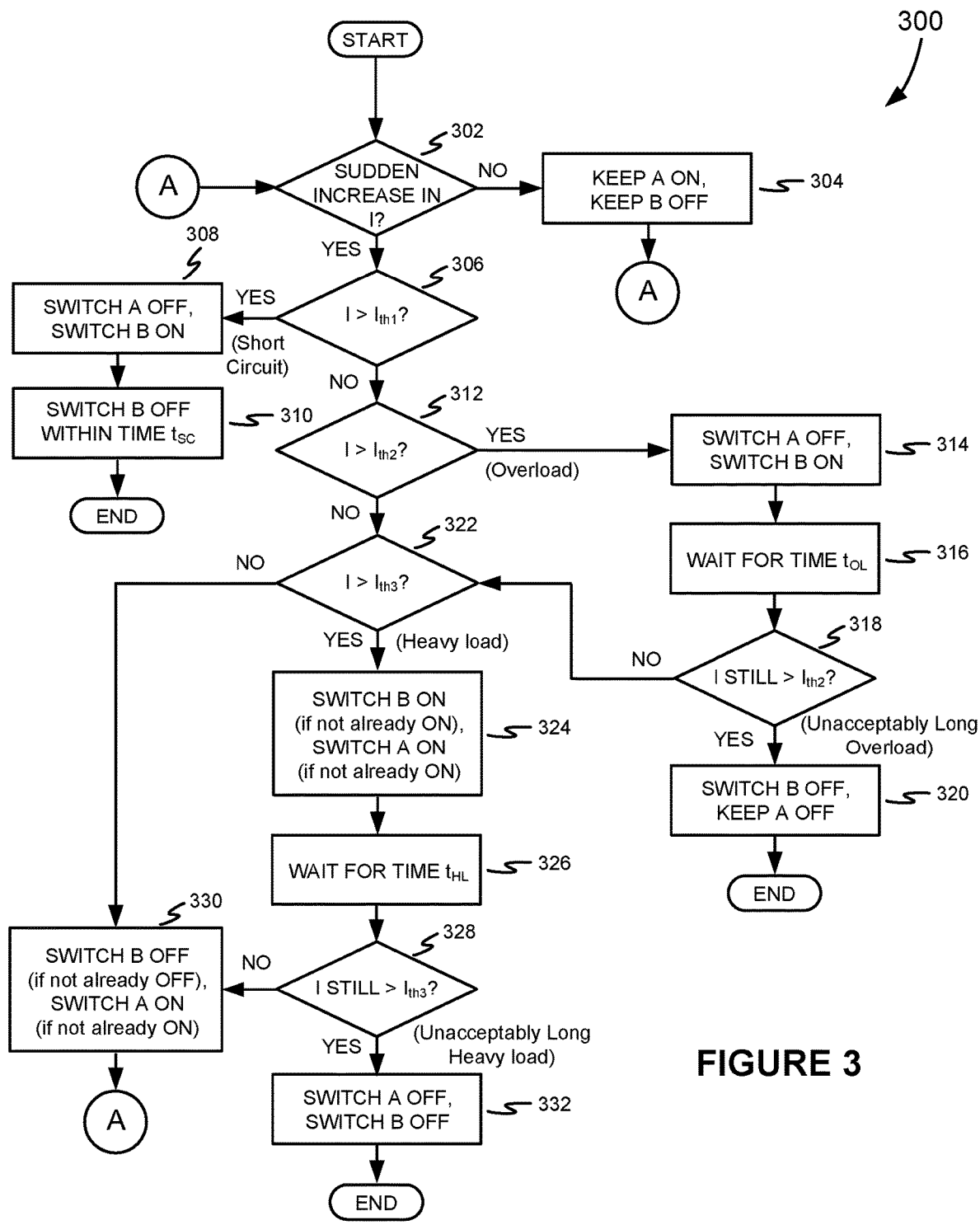
FIG. 3 is a flowchart of a circuit protection method performed by the solid-state circuit protector depicted in FIG. 1, according to one embodiment of the present invention.

FIG. 3 is a flowchart showing the various operations the microcontroller 104 is configured to perform, as directed by the computer program instructions stored in the nonvolatile portion of the computer-readable memory 108, when performing the "circuit protection method" 300 summarized above. At the START of the circuit protection method 300, it is assumed that: 1) the circuit is operating normally; 2) the circuit current I is at a normal level below (e.g., less than 80% of) the rated current $I_{RATED}$ of the solid-state circuit protector 100; 3) the conventional power semiconductor device 102a is ON; 4) the diamond-based power semiconductor device 102b is OFF; and 5) all of the circuit current I is being conducted through the Normal current path. During decision 302 the microcontroller 104 monitors the circuit current I, as measured or sensed by the current/voltage sensor 110. In the absence of any sudden increase in circuit current ("NO" at decision 302), the microcontroller 104 directs the driver 106 to generate drive signals that keep the conventional power semiconductor device 102a ON and the diamond-based power semiconductor device 102b OFF, as indicated by step 304 in the flowchart. Note that the conventional power semiconductor device 102a ("Device A") is referred to in the flowchart simply as "A" (an abbreviation for "Device A"), consistent with the drawing of the solid-state circuit protector 100 in FIG. 2, and the diamond-based power semiconductor device 102b ("Device B") is referred to simply as "B" (an abbreviation for "Device B").

If a sudden increase in circuit current I is determined at decision 302 ("YES" at decision 302), at decision 306 the microcontroller 104 then determines whether the sudden increase in circuit current I is perhaps indicative of a short circuit (or imminent short circuit). This decision 306 is performed by comparing the circuit current I to a predetermined first current threshold $I_{th1}$. The first current threshold $I_{th1}$ can be defined in various ways. In one embodiment of the invention it is defined to be some multiple M of the rated current $I_{RATED}$ of the solid-state device 102. For example, if M=6, then $I_{th1}=6\times I_{RATED}$. In one embodiment of the invention the rated current $I_{RATED}$ is the maximum current that the solid-state device 102 is capable of carrying indefinitely without resulting in irreversible damage to either the conventional power semiconductor device 102a or diamond-based power semiconductor device 102b. In another embodiment of the invention (discussed below), the rated current $I_{RATED}$ is defined and set by a user of the solid-state circuit protector 100 via a man-machine interface 112, as will be discussed further below, but the maximum possible user-defined value for $I_{RATED}$ is limited so that neither the conventional power semiconductor device 102a nor the diamond-based power semiconductor device 102b can be damaged.

If the microcontroller 104 determines that the circuit current I exceeds $I_{th1}$ at decision 306 ("YES" at decision 306), a short circuit condition is declared. The microcontroller 104 then directs the driver 106 to switch the conventional power semiconductor device 102a OFF, as soon as possible, so that both the conventional and diamond-based power semiconductor devices 102a and 102b are then OFF, thereby breaking the circuit. Alternatively, in accordance with another embodiment of the invention, once the microcontroller 104 determines that the circuit current I exceeds $I_{th1}$ at decision 306, at step 308 it directs the driver 106 to switch the conventional power semiconductor device 102a OFF and to switch the diamond-based power semiconductor device 102b ON temporarily. This causes the short circuit current to be redirected into the Bypass current path, thus protecting the conventional power semiconductor device 102a from being thermally damaged due to excessive $I^2R_{ON}$ heating. During the short-circuit event, the diamond-based power semiconductor device 102b is allowed to stay ON at step 308 only for a short time referred to herein as the "short-circuit time-to-trip $t_{SC}$," so that the short-circuit current does not damage the circuit's load and/or cause excessive heating and possible fire in the circuit's electrical wiring. After the short-circuit time-to-trip $t_{SC}$ expires, at step 310 the microcontroller 104 directs the driver 106 to switch the diamond-based power semiconductor device 102b back OFF, so that both the conventional and diamond-based power semiconductor devices 102a and 102b are then OFF, thereby breaking the circuit.

Figure 4:
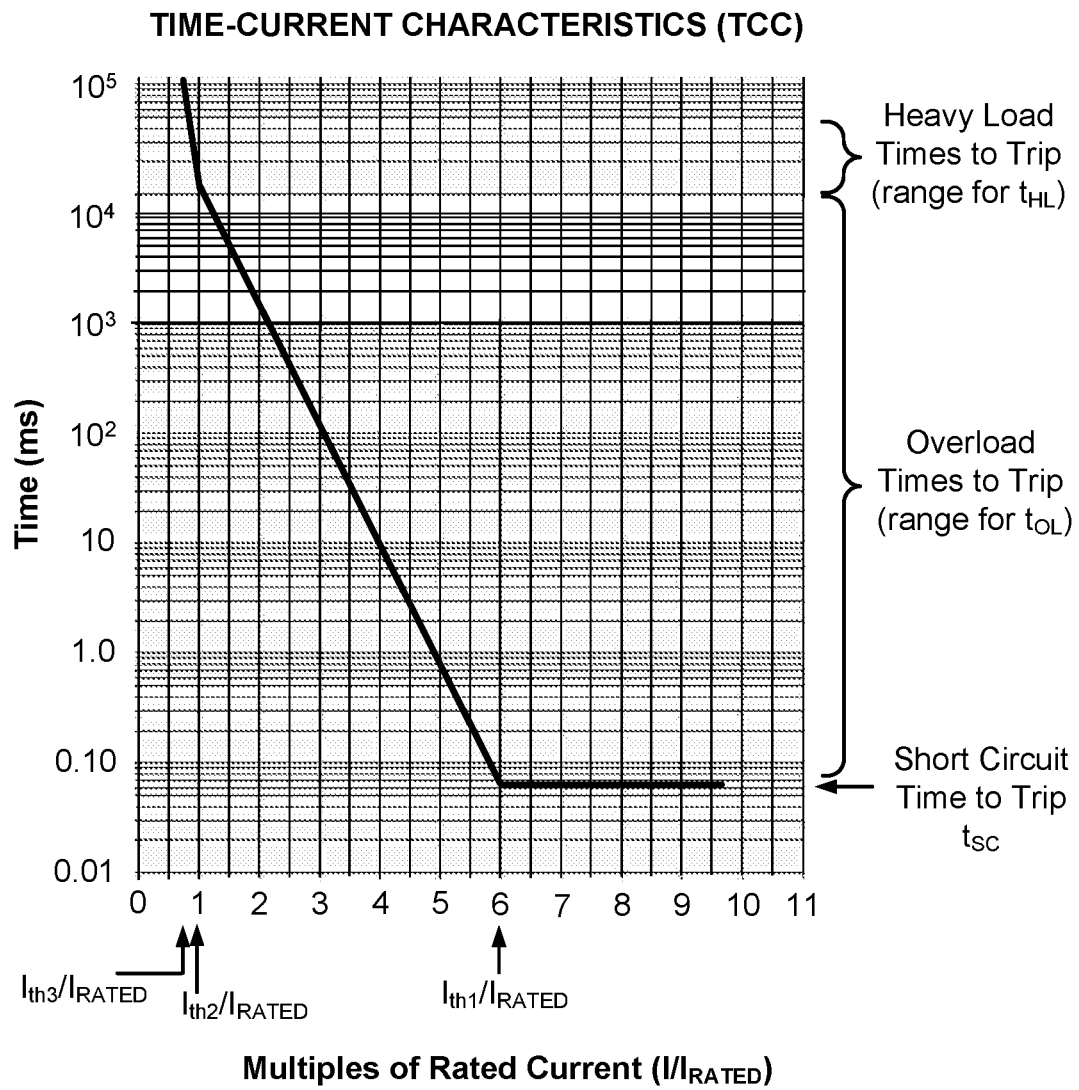
FIG. 4 is a graph showing exemplary time-current characteristics (TCC) of the solid-state circuit protector depicted in FIG. 1.

FIG. 4 is a graph illustrating exemplary time-current characteristics (TCC) of the solid-state circuit protector 100. The location of the first current threshold $I_{th1}$ and the short-circuit time-to-trip $t_{SC}$ are shown on the TCC curve. Also shown are the rated current $I_{RATED}$ and second and third current thresholds $I_{th2}$ and $I_{th3}$. The second and third current thresholds $I_{th2}$ and $I_{th3}$ demarcate two trip-current ranges for circuit currents that do not rise to a level of a short circuit but nevertheless might be harmful if allowed to persist in the circuit for times greater than indicated by the TCC curve. Specifically, the current range $I_{th2}<I<I_{th1}$ defines an "overload" current range for currents that do not rise to the level of a short circuit but which could be harmful to the solid-state device 102 or the load and circuit wiring if allowed to persist for times longer than indicated by the TCC curve. A second current range $I_{th3}<I<I_{th2}$ defines "heavy load" currents, which, although not rising to the level of overload currents, may nevertheless be harmful if allowed to persist for times longer than indicated by the TCC curve. Note that $t_{OL}$ and $t_{HL}$ represent the times-to-trip for the overload current range current range $I_{th2}<I<I_{th1}$ defines and heavy load current range $I_{th3}<I<I_{th2}$, respectively. Both are current dependent. In other words, each varies depending on what the magnitude of the circuit current happens to be during any given overload or heavy load event. Since heavy load currents are not as high as overload currents, the solid-state circuit protector 100 is able to tolerate heavy loads for longer times than overloads. This difference is reflected in the exemplary TCC curve shown in FIG. 4. For example, when an overload current of $4\times I_{RATED}$ is flowing in the circuit, the TCC curve shows that the solid-state circuit protector 100 will tolerate that particular overload current for up to about $t_{OL}=10$ ms before tripping, and the TCC curve also shows that when a heavy load current of $0.8\times I_{RATED}$ is flowing, the solid-state circuit protector 100 will tolerate the heavy load for a significantly longer time, approximately $t_{HL}=5\times 10^4$ ms (or 50 sec), before tripping.

According to one embodiment of the invention, the solid-state circuit protector 100 further includes a man-machine interface (e.g., a universal serial port (USB) interface) 112 (se FIG. 2) that provides the ability for an external computer (e.g., a laptop computer or other hand-held computer) to connect to and communicate with the microcontroller 104. In that particular embodiment of the invention, the computer program instructions stored in the computer readable memory 108 further include instructions that provide a user of the solid-state circuit protector 100 (e.g., an electrician or engineer) the ability to define and set the trip-current settings of the solid-state circuit protector 100, including one or more of: the rated current $I_{RATED}$, short-circuit time-to-trip $t_{SC}$, overload current threshold $I_{th2}$, overload time-to-trip range (for $t_{OL}$), heavy load current threshold $I_{th3}$, and heavy load time-to-trip range (for $t_{HL}$). By providing the microcontroller 104 and a user this capability, the user can then modify or adapt the solid-state circuit protector's 100's TCC curve to best suit a particular application.

Referring back to the flowchart in FIG. 3, if at decision 306 it is determined that the circuit current I has not suddenly increased to a value indicative of a short circuit or an imminent short circuit ("NO" at decision 306), decision 312 is performed to determine whether the sudden increase in current might nevertheless represent an overload that can be tolerated for the current-dependent overload time-to-trip $t_{OL}$. If YES ($I>I_{th2}$), at step 314 the microcontroller 104 directs the driver 106 to switch the conventional power semiconductor device 102a OFF and to switch the diamond-based power semiconductor device 102b ON. The overload current is thus redirected into the Bypass current path so that if flows entirely through the diamond-based power semiconductor device 102b. With no current flowing through the conventional power semiconductor device 102a, the conventional power semiconductor device 102a is then allowed to cool, in anticipation of lighter loads. In an alternative embodiment, the conventional power semiconductor device 102a is allowed to remain ON after the diamond-based power semiconductor device 102b is switched ON at step 314, so that the conventional and diamond-based power semiconductor devices 102a and 102b share the burden of passing the overload current. In this way the conventional power semiconductor device 102a is relieved from having to handle the full overload current by itself and can run cooler with a lower ON resistance $R_{ON}$.

At decision 318, after (or just prior to) the overload time-to-trip $t_{OL}$ expiring, the microcontroller 104 determines whether the overload has cleared or is still present. If still present ("YES" at decision 318), an unacceptably long overload condition is declared and at step 320 the microcontroller 104 directs the driver 106 to switch the diamond-based power semiconductor device 102b OFF (and switch the conventional power semiconductor device 102a OFF, if not already OFF). The solid-state circuit protector 100 then remains in this tripped state until an electrician or engineer can be dispatched to investigate why the overload would not clear.

Decision 322 is performed under two scenarios: 1) after the microcontroller 104 determines at decision 318 that the circuit current has reduced to a value lower than the overload current range $I_{th2}<I<I_{th1}$; and 2) after the microcontroller 104 determines at decision 312 that the sudden increase in current first determined at decision 302 has not risen to a level indicative of a short circuit or overload but nevertheless may still be indicative of a heavy load condition. Under either scenario, if at decision 322 it is determined that $I>I_{th3}$ ("YES" at decision 322), at step 324 the microcontroller 104 directs the driver 106 to switch the conventional power semiconductor device 102a ON (if not already ON) and also switch the diamond-based power semiconductor device 102b ON. In this manner the conventional power semiconductor and diamond-based power semiconductor devices 102a and 102b share the heavy load. The heat build up due to the heavy load will ensure that the diamond-based power semiconductor device 102b operates efficiently while the conventional power semiconductor device 102a operates cooler with a lower ON resistance $R_{ON}$. (In an alternative embodiment, at step 324 the conventional power semiconductor device 102a is switched OFF (if not already OFF) and the diamond-based power semiconductor device 102b is switched ON, so that the diamond-based power semiconductor device 102b handles the heavy load by itself and the conventional power semiconductor device 102a is allowed to cool, in anticipation of lighter loads.)

If the microcontroller 104 determines at decision 322 that the heavy load has cleared or is no longer present, i.e., $I<I_{th3}$ ("NO" at decision 322), at step 330 the microcontroller 104 directs the driver 106 to switch the conventional power semiconductor device 102a back ON (if not already ON) and switch the diamond-based power semiconductor device 102b OFF (if not already OFF). The method 300 then returns to decision 302 and normal operating conditions resume. Step 330 is also performed if after waiting for the heavy load time-to-trip $t_{HL}$ at step 326 the microcontroller 104 determines that the heavy load has cleared and is no longer present. On the other hand, if the heavy load is determined to still be present, even after the heavy load time-to-trip $t_{HL}$ has expired ("YES" at decision 328), an unacceptably long heavy load condition is declared and at step 332 the microcontroller 104 directs the driver 106 to switch OFF both the conventional and diamond-based power semiconductor devices 102a and 102b. The solid-state circuit protector 100 then remains in this tripped state until an electrician or engineer can be dispatched to investigate why the heavy load would not clear.

Figure 5:
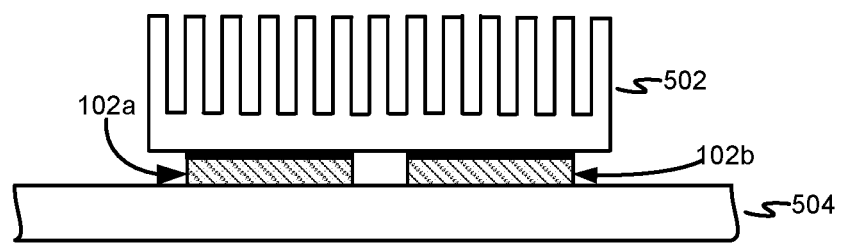
FIG. 5 is a drawing illustrating how the conventional and diamond-based power semiconductor devices of the solid-state circuit protector depicted in FIG. 1 can be mounted on a printed circuit board (PCB) and configured to share a common heatsink to thereby facilitate an "$R_{ON}$ balancing" technique, according to one embodiment of the present invention.

In the exemplary circuit protection method 300 described above, the conventional power semiconductor device 102a is switched OFF whenever a short circuit, overload, or heavy load occurs and the diamond-based power semiconductor device 102b is switched ON only when a short circuit, overload, or heavy load is determined. In another embodiment of the invention an "$R_{ON}$ balancing" technique is employed in which both the conventional power semiconductor device 102a and diamond-based power semiconductor device 102b are configured to remain ON during normal operating conditions and to also remain ON during abnormal conditions (short circuit, overload, and heavy load) for times within the limits set by the time-to-trip settings $t_{SC}$, $t_{OL}$, and $t_{HL}$. The conventional and diamond-based power semiconductor devices 102a and 102b are constructed so that during times when the circuit current and temperature of the solid-state device 102 are low, the conventional power semiconductor device 102a has a lower ON resistance than the diamond-based power semiconductor device 102b and, conversely, so that during times when the circuit current and temperature of the solid-state device 102 are high, the diamond-based power semiconductor device 102b has a lower ON resistance than the conventional power semiconductor device 102a. Accordingly, at lower temperatures most of the circuit current flows through the conventional power semiconductor device 102a and at higher temperatures most of the circuit current flows through the diamond-based power semiconductor device 102b. To ensure that the heat generated by the conventional power semiconductor device 102a is transferred to the diamond-based power semiconductor device 102b as the circuit current through the conventional power semiconductor device 102a rises, in one embodiment of the invention the conventional and diamond-based power semiconductor devices 102a and 102b are thermally coupled (for example, using a heatsink 502) and configured in close proximity (for example, on a printed circuit board (PCB) 504), as illustrated in FIG. 5. Because of the negative correlation of $R_{ON}$ with temperature in the diamond-based power semiconductor device 102b and the positive correlation of $R_{ON}$ with temperature in the conventional power semiconductor device 102a, as the temperature rises more and more current flows through the diamond-based power semiconductor device 102b and less and less current flows through the conventional power semiconductor device 102a. Note that the transfer of responsibility for carrying current happens naturally in this embodiment of the invention, so a microcontroller is not even needed to redirect or transfer the current carrying responsibility from the conventional power semiconductor device 102a to the diamond-based power semiconductor device 102b and vice versa. Nevertheless, a controller is preferred, in order to be able to switch OFF both devices 102a and 102b in circumstances where the current-dependent time-to-trip parameters $t_{SC}$, $t_{OL}$, and $t_{HL}$ are exceeded.

While various embodiments of the present invention have been presented, they have been presented by way of example and not limitation. Those persons skilled in the relevant art will appreciate and understand that various changes in form and detail may be made to the exemplary embodiments of the invention described in the detailed description, without departing from the true spirit and scope of the invention. The scope of the invention should therefore not be restricted to the specifics of the exemplary embodiments of the invention described in the detailed description but instead should be determined by the appended claims, including the full scope of equivalents to which such claims are entitled.

What is claimed is:

1. A solid-state circuit protector, comprising;
   a first power semiconductor device having an ON resistance that increases with increasing temperature; and
   a second power semiconductor device connected in parallel with the first power semiconductor device having an ON resistance that decreases with increasing temperature,
   wherein the second power semiconductor device comprises a power semiconductor device having a diamond semiconductor current path, a diamond semiconductor channel, or a diamond semiconductor base.

2. The solid-state circuit protector of claim 1, wherein the second power semiconductor device has a control terminal that allows it to be controlled to operate as a switch, and the solid-state circuit protector further comprises a controller that controls whether the second power semiconductor device is switched ON or is switched OFF.

3. The solid-state circuit protector of claim 2, wherein the controller is configured to:
   determine whether a current flowing through the first power semiconductor device is representative of a short circuit or imminent short circuit; and
   switch the first power semiconductor OFF and the second power semiconductor ON temporarily for a short-circuit time-to-trip $t_{SC}$, if it determines that the current flowing through the first power semiconductor device is representative of a short circuit or imminent short circuit.

4. The solid-state circuit protector of claim 3, wherein the controller is further configured to:
   determine whether a current flowing through the first power semiconductor device is representative of an overload;
   switch the second power semiconductor ON, if the controller determines that the current flowing through the first power semiconductor device is representative of an overload; and
   switch the second power semiconductor back OFF if the overload has persisted for an overload time-to-trip $t_{OL}$.

5. The solid-state circuit protector of claim 4, wherein controller is further configured to:
   determine whether a current flowing through the first power semiconductor device is representative of a heavy load;
   switch the second power semiconductor ON, if the controller determines that the current flowing through the first power semiconductor device is representative of a heavy load; and
   switch the second power semiconductor back OFF if the heavy load has persisted for a heavy load time-to-trip $t_{HL}$.

6. The solid-state circuit protector of claim 2, further comprising a man-machine interface in electrical communication with the controller that provides an external computer and a user of the external computer the ability to define and set one or more trip-current settings for the solid-state circuit protector.

7. The solid-state circuit protector of claim 6, wherein the user-defined one or more trip-current settings include(s) a first current threshold, above which a short circuit condition is defined, and a short-circuit time-to-trip $t_{SC}$.

8. The solid-state circuit protector of claim 7, wherein the user-defined one or more trip-current settings further include:
   a second current threshold, which along with the first current threshold define a range of overload currents, and
   a range of overload times-to-trip corresponding to the range of overload currents.

9. The solid-state circuit protector of claim 8, wherein the user-defined one or more trip-current settings further include:
   a third current threshold, which along with the second current threshold define a range of heavy load currents, and
   a range of heavy load times-to-trip corresponding to the range of heavy load currents.

10. The solid-state circuit protector of claim 2, wherein the first and second power semiconductor devices are configured to both remain ON during normal operating conditions and to also remain ON during short-circuit, overload, and heavy load conditions but only for durations dictated by predefined time-current characteristics of the solid-state circuit protector.

11. A circuit protection method, comprising:
   monitoring a current flowing through a solid-state device that includes a first power semiconductor device connected in parallel with a second power semiconductor device, the first power semiconductor device having an ON resistance that increases with increasing temperature and the second power semiconductor device having an ON resistance that decreases with increasing temperature;
   determining whether the current exceeds a first current threshold representative of a short circuit or imminent short circuit; and
   switching the first power semiconductor device OFF if the current is determined to exceed the first current threshold,
   wherein the second power semiconductor device has a diamond semiconductor current path.

12. The circuit protection method of claim 11, wherein the second power semiconductor device comprises a field-effect transistor (FET) having a diamond semiconductor source-drain channel or comprises a bipolar transistor having a diamond semiconductor base.

13. The circuit protection method of claim 11, further comprising switching the second power semiconductor device OFF or maintaining the second power semiconductor device OFF, if already OFF, if the current is determined to exceed the first current threshold.

14. The circuit protection method of claim 11, further comprising:

switching the second power semiconductor device ON temporarily, when the current is determined to exceed the first current threshold; and switching the second power semiconductor device OFF after a short circuit time-to-trip $t_{SC}$ has expired.

15. The circuit protection method of claim 11, further comprising:

determining whether the current exceeds a second current threshold representative of an overload, if the current is determined not to exceed the first current threshold;

switching the first power semiconductor OFF and the second power semiconductor ON, if not already ON, if the current is determined to exceed the second current threshold and an overload is present; and switching the second power semiconductor device OFF, if the overload has persisted for an overload time-to-trip $t_{OL}$.

16. The circuit protection method of claim 11, further comprising:

determining whether the current exceeds a second current threshold representative of an overload, if the current is determined not to exceed the first current threshold;

keeping the first power semiconductor device ON and switching the second power semiconductor ON, if not already ON, if the current is determined to exceed the second current threshold and an overload is present; and switching the first and second power semiconductor devices OFF, if the overload has persisted for an overload time-to-trip $t_{OL}$.

17. The circuit protection method of claim 16, further comprising:

determining whether the current exceeds a third current threshold representative of a heavy load, if the current is determined not to exceed the second current threshold;

switching the first power semiconductor OFF and the second power semiconductor ON, if not already ON, if the current is determined to exceed the third current threshold and a heavy load is present; and switching the second power semiconductor device OFF, if the heavy load has persisted for a heavy load time-to-trip $t_{HL}$.

18. The circuit protection method of claim 16, further comprising:

determining whether the current exceeds a third current threshold representative of a heavy load, if the current is determined not to exceed the second current threshold;

keeping the first power semiconductor device ON and switching the second power semiconductor ON, if not already ON, if the current is determined to exceed the third current threshold and a heavy load is present; and switching the first and second power semiconductor devices OFF, if the heavy load has persisted for a heavy load time-to-trip $t_{HL}$.

* * * * *